United States Patent
Veregin et al.

(10) Patent No.: US 7,166,402 B2
(45) Date of Patent: *Jan. 23, 2007

(54) EMULSION AGGREGATION TONER HAVING GLOSS ENHANCEMENT AND TONER RELEASE WITH STABLE XEROGRAPHIC CHARGING

(75) Inventors: Richard P. N. Veregin, Mississauga (CA); Cuong Vong, Hamilton (CA); Karen A. Moffat, Brantford (CA); Daryl W. Vanbesien, Burlington (CA); Enno E. Agur, Toronto (CA)

(73) Assignee: Xerox Corporation, Stamford, CT (US)

(*) Notice: Subject to any disclaimer, the term of this patent is extended or adjusted under 35 U.S.C. 154(b) by 317 days.

This patent is subject to a terminal disclaimer.

(21) Appl. No.: 10/876,565

(22) Filed: Jun. 28, 2004

(65) Prior Publication Data
US 2005/0287458 A1 Dec. 29, 2005

(51) Int. Cl.
G03G 9/08 (2006.01)
(52) U.S. Cl. .............. 430/108.4; 430/137.14
(58) Field of Classification Search ........... 430/108.4, 430/137.14
See application file for complete search history.

(56) References Cited

U.S. PATENT DOCUMENTS

| | | | |
|---|---|---|---|
| 3,847,604 A | 11/1974 | Hagenbach et al. | |
| 4,338,390 A | 7/1982 | Lu | |
| 4,935,326 A | 6/1990 | Creatura et al. | |
| 4,937,166 A | 6/1990 | Creatura et al. | |
| 5,278,020 A | 1/1994 | Grushkin et al. | |
| 5,290,654 A | 3/1994 | Sacripante et al. | |
| 5,308,734 A | 5/1994 | Sacripante et al. | |
| 5,344,738 A | 9/1994 | Kmiecik-Lawrynowicz et al. | |
| 5,346,797 A | 9/1994 | Kmiecik-Lawrynowicz et al. | |
| 5,348,832 A | 9/1994 | Sacripante et al. | |
| 5,364,729 A | 11/1994 | Kmiecik-Lawrynowicz et al. | |
| 5,366,841 A | 11/1994 | Patel et al. | |
| 5,370,963 A | 12/1994 | Patel et al. | |
| 5,403,693 A | 4/1995 | Patel et al. | |
| 5,405,728 A | 4/1995 | Hopper et al. | |
| 5,418,108 A | 5/1995 | Kmiecik-Lawrynowicz et al. | |
| 5,462,828 A | 10/1995 | Moffat et al. | |
| 5,496,676 A | 3/1996 | Croucher et al. | |
| 5,501,935 A | 3/1996 | Patel et al. | |
| 5,527,658 A | 6/1996 | Hopper et al. | |
| 5,585,215 A | 12/1996 | Ong et al. | |
| 5,650,255 A | 7/1997 | Ng et al. | |
| 5,650,256 A | 7/1997 | Veregin et al. | |
| 5,723,253 A | 3/1998 | Higashino et al. | |
| 5,744,520 A | 4/1998 | Kmiecik-Lawrynowicz et al. | |
| 5,747,215 A | 5/1998 | Ong et al. | |
| 5,763,133 A | 6/1998 | Ong et al. | |
| 5,766,818 A | 6/1998 | Smith et al. | |
| 5,804,349 A | 9/1998 | Ong et al. | |
| 5,827,633 A | 10/1998 | Ong et al. | |
| 5,840,462 A | 11/1998 | Foucher et al. | |
| 5,853,944 A | 12/1998 | Foucher et al. | |
| 5,869,215 A | 2/1999 | Ong et al. | |
| 5,916,725 A | 6/1999 | Patel et al. | |
| 5,965,316 A * | 10/1999 | Kmiecik-Lawrynowicz et al. | 430/137.14 |
| 6,120,967 A | 9/2000 | Hopper et al. | |
| 6,500,594 B2 * | 12/2002 | Hamano et al. ......... | 430/109.4 |
| 6,656,653 B2 * | 12/2003 | Mitsuhashi et al. .... | 430/108.23 |
| 2006/0057482 A1 * | 3/2006 | Yuasa ..................... | 430/108.2 |

OTHER PUBLICATIONS

U.S. Appl. No. 10/876,557, filed Jun. 28, 2004, Moffat et al.
U.S. Appl. No. 10/876,575, filed Jun. 28, 2004, Moffat et al.

* cited by examiner

Primary Examiner—John L Goodrow
(74) Attorney, Agent, or Firm—Oliff & Berridge, PLC

(57) ABSTRACT

A toner includes particles of a resin, an optional colorant, and an acid-containing crystalline polymeric wax, where the acid-containing crystalline wax is selected from carboxylic acid-terminated polyethylene waxes, high acid waxes, and mixtures thereof, and where the toner particles are prepared by an emulsion aggregation process.

19 Claims, 5 Drawing Sheets

EMULSION AGGREGATION TONER HAVING GLOSS ENHANCEMENT AND TONER RELEASE WITH STABLE XEROGRAPHIC CHARGING

BACKGROUND OF THE INVENTION

1. Field of Invention

This invention relates to toners and developers containing the toners for use in forming and developing images of good quality and gloss, and in particular to toners having novel combinations of wax components to provide the desired print quality and high gloss, and to provide stable xerographic charging in all ambient environments.

2. Description of Related Art

Emulsion aggregation toners are excellent toners to use in forming print and/or xerographic images in that the toners can be made to have uniform sizes and in that the toners are environmentally friendly. U.S. patents describing emulsion aggregation toners include, for example, U.S. Pat. Nos. 5,370,963, 5,418,108, 5,290,654, 5,278,020, 5,308,734, 5,344,738, 5,403,693, 5,364,729, 5,346,797, 5,348,832, 5,405,728, 5,366,841, 5,496,676, 5,527,658, 5,585,215, 5,650,255, 5,650,256, 5,501,935, 5,723,253, 5,744,520, 5,763,133, 5,766,818, 5,747,215, 5,827,633, 5,853,944, 5,804,349, 5,840,462, and 5,869,215, the entire disclosures of which are incorporated herein by reference.

Two main types of emulsion aggregation toners are known. First is an emulsion aggregation process that forms acrylate based, e.g., styrene acrylate, toner particles. See, for example, U.S. Pat. No. 6,120,967, incorporated herein by reference in its entirety, as one example of such a process. Second is an emulsion aggregation process that forms polyester, e.g., sodio sulfonated polyester. See, for example, U.S. Pat. No. 5,916,725, incorporated herein by reference in its entirety, as one example of such a process.

Emulsion aggregation techniques typically involve the formation of an emulsion latex of the resin particles, which particles have a small size of from, for example, about 5 to about 500 nanometers in diameter, by heating the resin, optionally with solvent if needed, in water, or by making a latex in water using an emulsion polymerization. A colorant dispersion, for example of a pigment dispersed in water, optionally also with additional resin, is separately formed. The colorant dispersion is added to the emulsion latex mixture, and an aggregating agent or complexing agent is then added to form aggregated toner particles. The aggregated toner particles are heated to enable coalescence/fusing, thereby achieving aggregated, fused toner particles.

U.S. Pat. No. 5,462,828 describes a toner composition that includes a styrene/n-butyl acrylate copolymer resin having a number average molecular weight of less than about 5,000, a weight average molecular weight of from about 10,000 to about 40,000 and a molecular weight distribution of greater than 6 that provides excellent gloss and high fix properties at a low fusing temperature.

What is still desired is a styrene acrylate type emulsion aggregation toner that can achieve excellent print quality, particularly gloss, and stable xerographic charging in all ambient environments for all colors.

SUMMARY OF THE INVENTION

The present invention comprises a toner having a specified wax that enables the toner to achieve the objects of the invention, mainly to achieve a toner exhibiting excellent gloss properties and stable xerographic charge in all ambient environments.

In embodiments, the present invention provides a toner comprising particles of a resin, an optional colorant, and a crystalline wax, such as a crystalline polymeric wax, wherein the crystalline wax is selected from the group consisting of carboxylic acid-terminated polyethylene waxes, high acid waxes, and mixtures thereof, and wherein said toner particles are prepared by an emulsion aggregation process.

In embodiments, the present invention also provides methods for making such toners.

BRIEF DESCRIPTION OF THE DRAWINGS

A more complete understanding of the present invention can be obtained by reference to the accompanying drawings wherein.

DETAILED DESCRIPTION OF EXEMPLARY EMBODIMENTS

Figure 1:
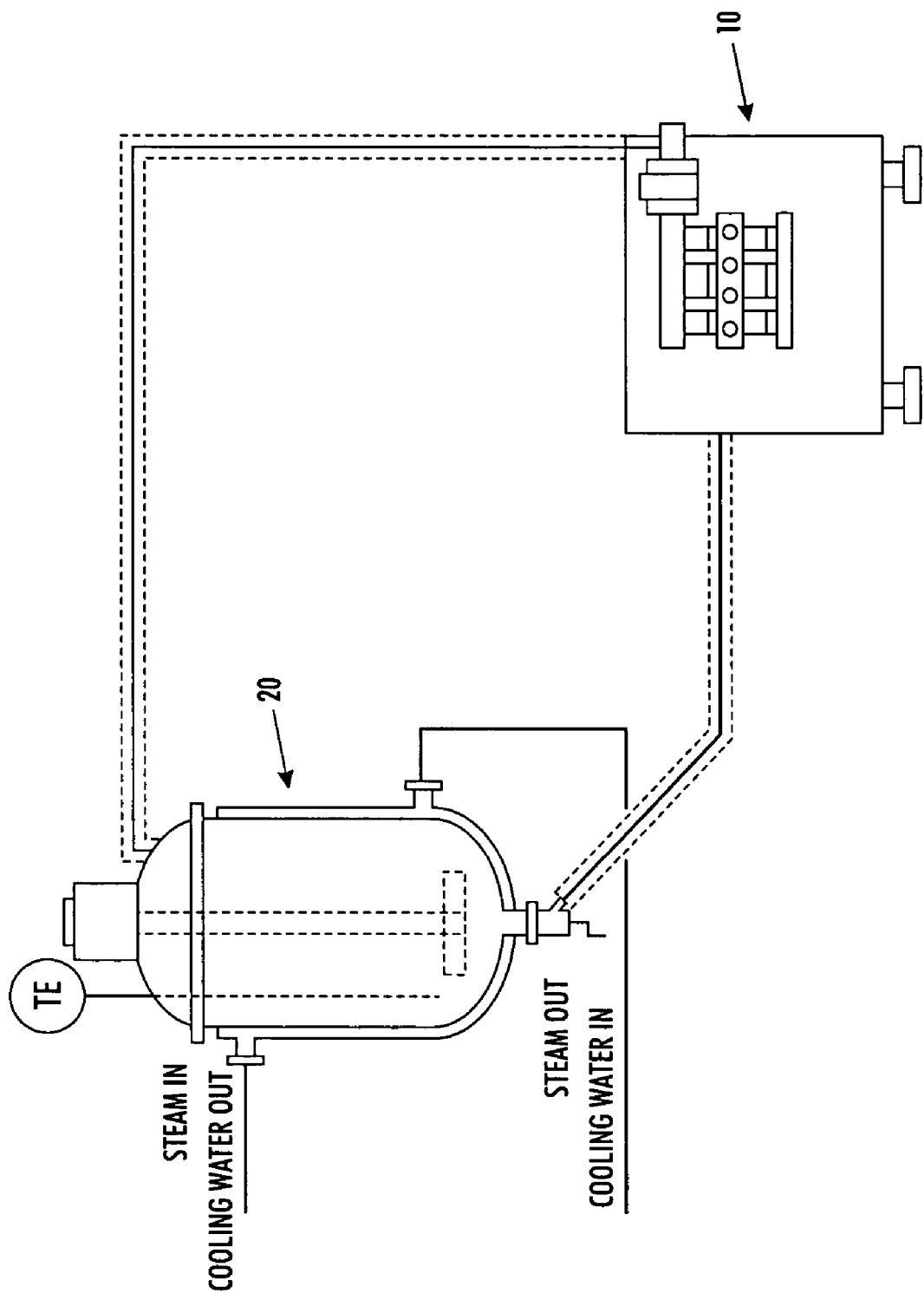
FIG. 1 illustrates an embodiment of a high pressure wax homogenization process.
Figure 2A:
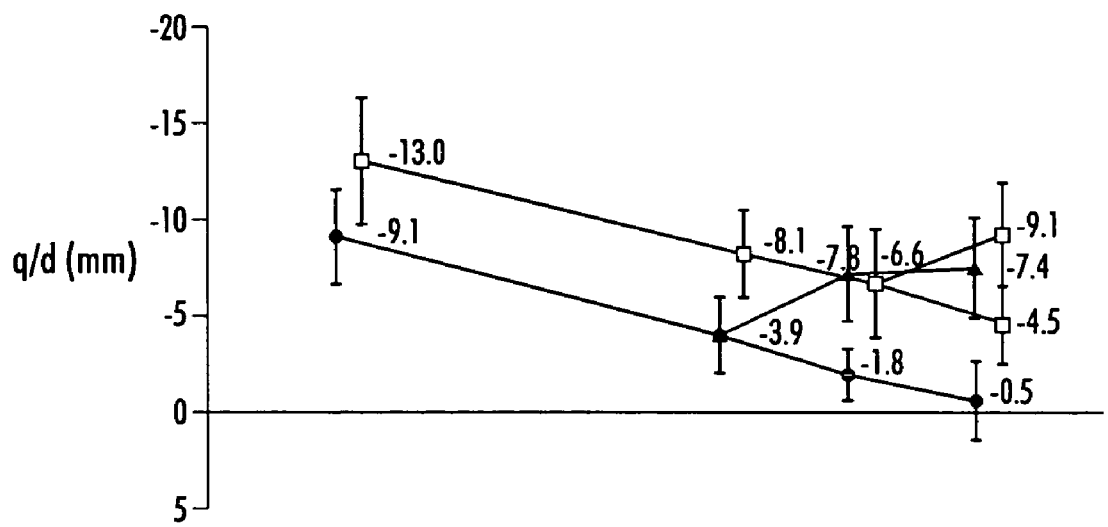
FIGS. 2a–2h illustrates charging and admix properties of developers described in the Examples and Comparative Examples.
Figure 2B:
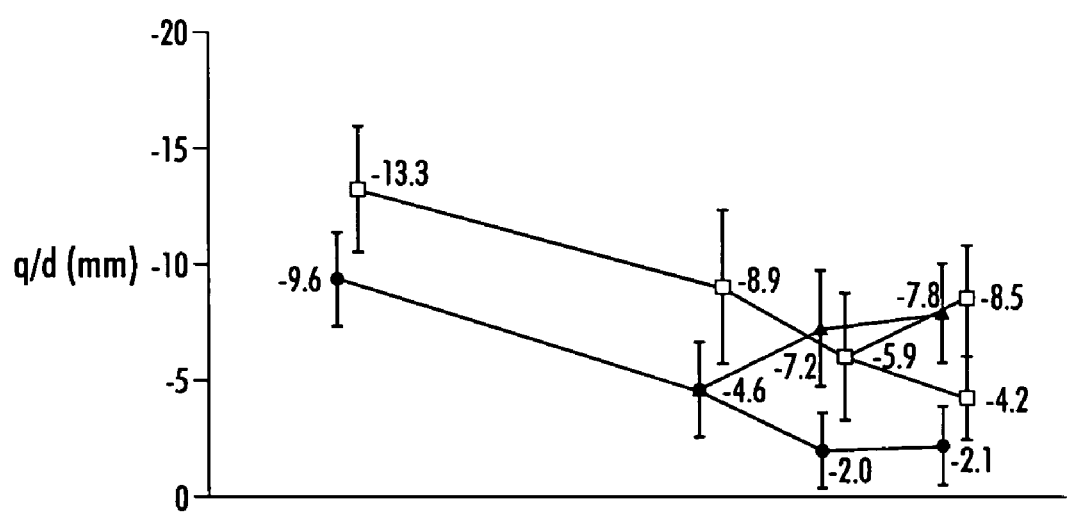
Figure 2C:
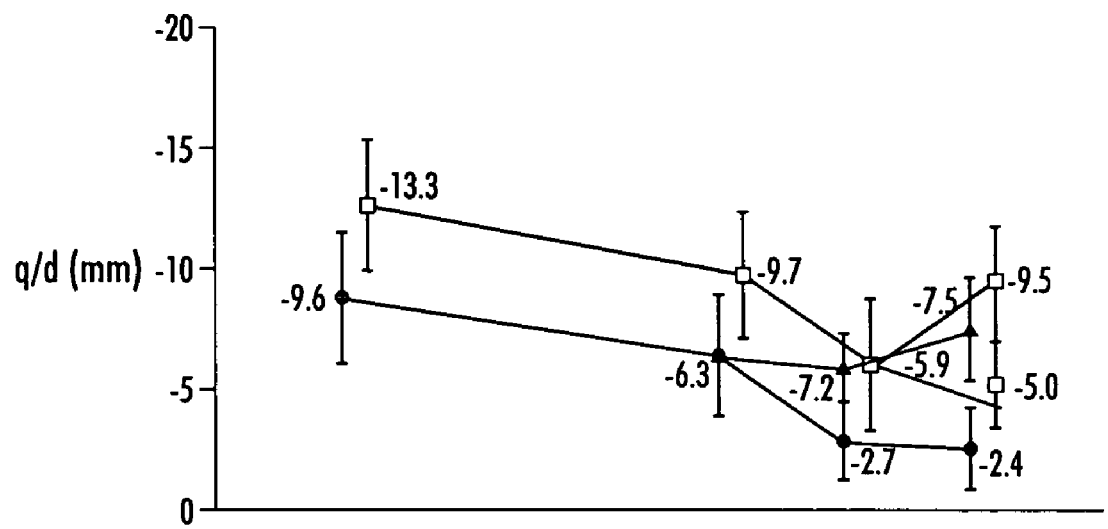
Figure 2D:
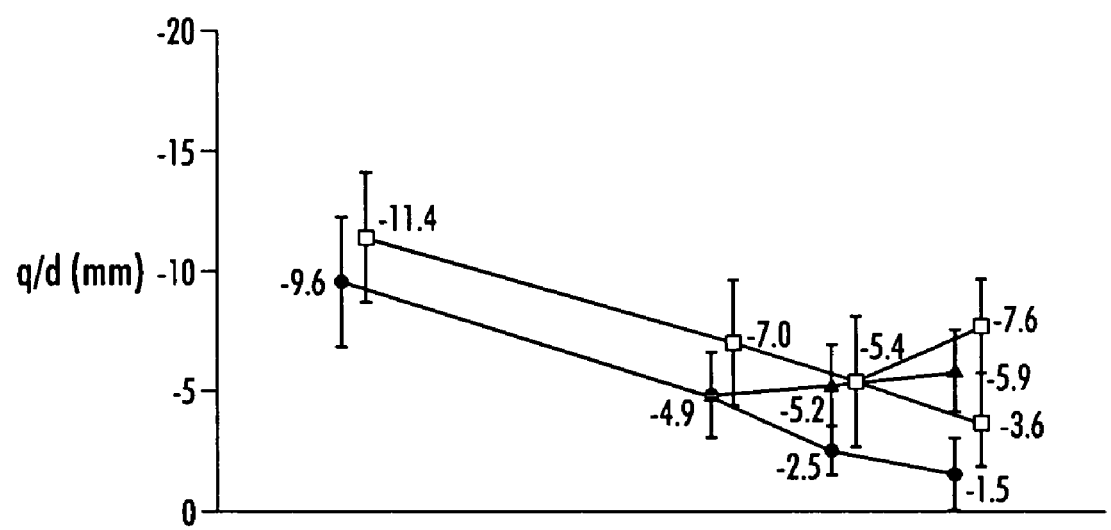
Figure 2E:
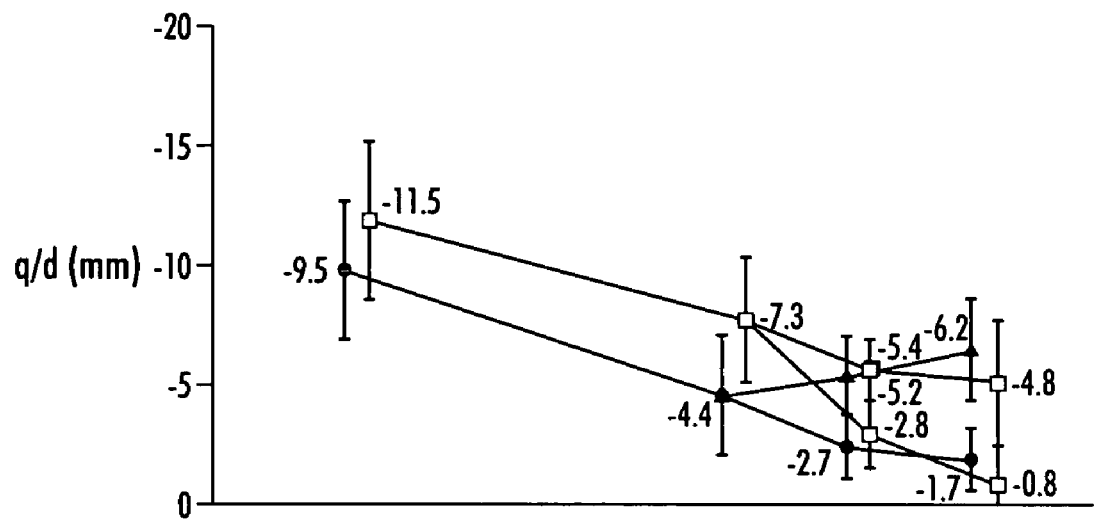
Figure 2F:
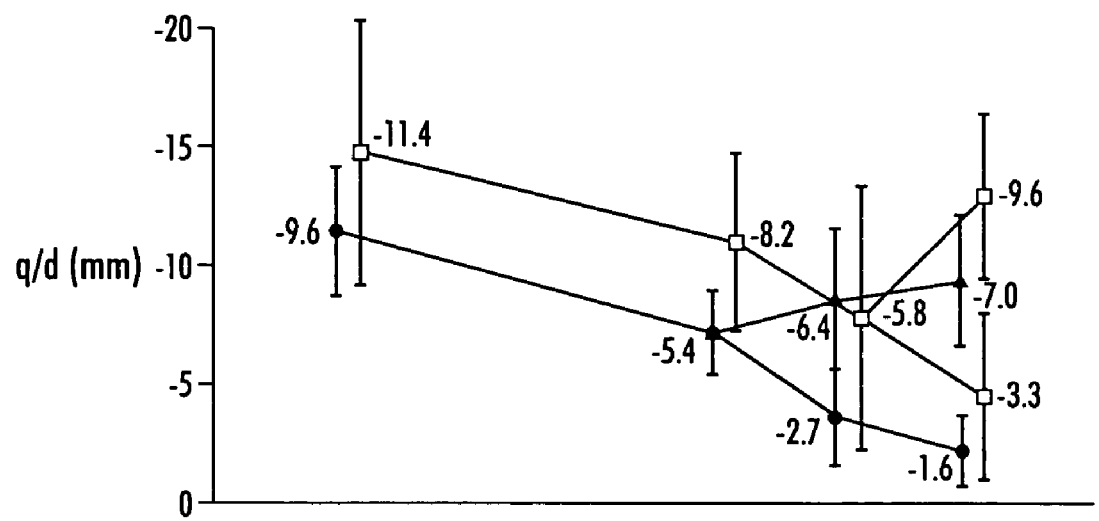
Figure 2G:
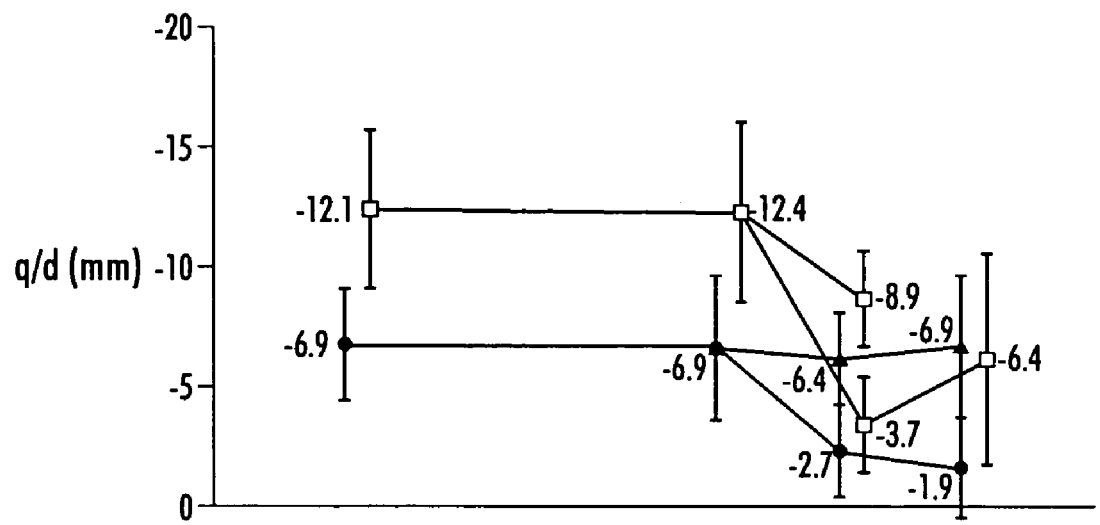
Figure 2H:
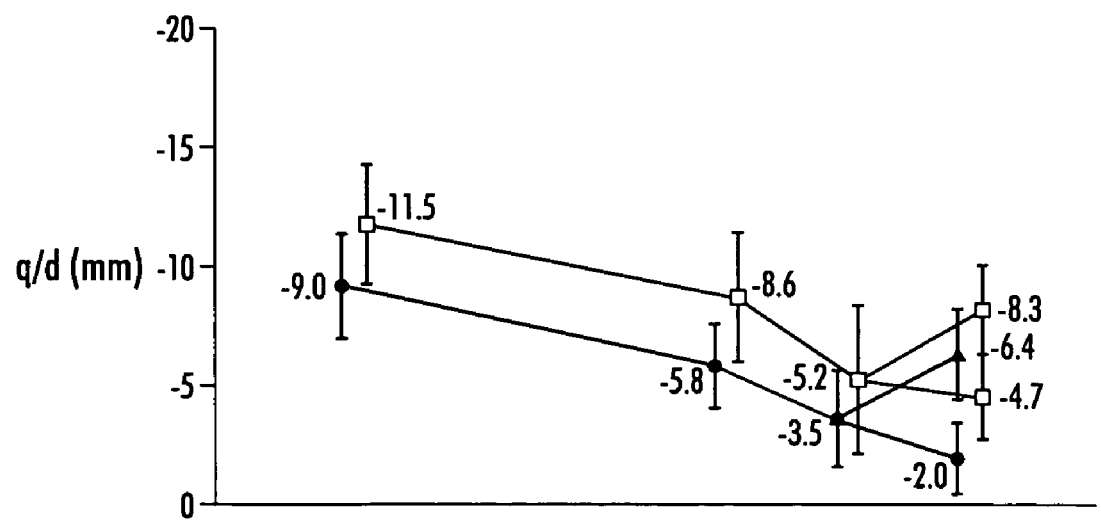

The toner of the invention is comprised of toner particles comprised of at least a latex emulsion polymer resin and a colorant dispersion. The toner particles preferably also include at least a wax dispersion, a coagulant and a colloidal silica.

Illustrative examples of specific latex for resin, polymer or polymers selected for the toner of the present invention include, for example, poly(styrene-alkyl acrylate), poly(styrene-1,3-diene), poly(styrene-alkyl methacrylate), poly(styrene-alkyl acrylate-acrylic acid), poly(styrene-1,3-diene-acrylic acid), poly(styrene-alkyl methacrylate-acrylic acid), poly(alkyl methacrylate-alkyl acrylate), poly(alkyl methacrylate-aryl acrylate), poly(aryl methacrylate-alkyl acrylate), poly(alkyl methacrylate-acrylic acid), poly(styrene-alkyl acrylate-acrylonitrile-acrylic acid), poly(styrene-1,3-diene-acrylonitrile-acrylic acid), poly(alkyl acrylate-acrylonitrile-acrylic acid), poly(styrene-butadiene), poly(methylstyrene-butadiene), poly(methyl methacrylate-butadiene), poly(ethyl methacrylate-butadiene), poly(propyl methacrylate-butadiene), poly(butyl methacrylate-butadiene), poly(methyl acrylate-butadiene), poly(ethyl acrylate-butadiene), poly(propyl acrylate-butadiene), poly(butyl acrylate-butadiene), poly(styrene-isoprene), poly(methylstyrene-isoprene), poly(methyl methacrylate-isoprene), poly(ethyl methacrylate-isoprene), poly(propyl methacrylate-isoprene), poly(butyl methacrylate-isoprene), poly(methyl acrylate-isoprene), poly(ethyl acrylate-isoprene), poly(propyl acrylate-isoprene), and poly(butyl acrylate-isoprene); poly(styrene-propyl acrylate), poly(styrene-butyl acrylate), poly(styrene-butadiene-acrylic acid), poly(styrene-butadiene-methacrylic acid), poly(styrene-butadiene-acrylonitrile-acrylic acid), poly(styrene-butyl acrylate-acrylic acid), poly(styrene-butyl acrylate-methacrylic acid), poly(styrene-butyl acrylate-acrylonitrile), poly(styrene-butyl acrylate-acrylonitrile-acrylic acid), and other similar polymers.

As the latex emulsion polymer of the inventive toner, preferably a styrene-alkyl acrylate is used. More preferably, the styrene-alkyl acrylate is a styrene/n-butyl acrylate copolymer resin, and most preferably, a styrene-butyl acrylate beta-carboxyethyl acrylate polymer.

The latex polymer is preferably present in an amount of from about 70 to about 95% by weight of the toner particles (i.e., toner particles exclusive of external additives) on a solids basis, preferably from about 75 to about 85% by weight of the toner.

The monomers used in making the selected polymer are not limited, and the monomers utilized may include any one or more of, for example, styrene, acrylates such as methacrylates, butylacrylates, β-carboxy ethyl acrylate (β-CEA), etc., butadiene, isoprene, acrylic acid, methacrylic acid, itaconic acid, acrylonitrile, benzenes such as divinylbenzene, etc., and the like. Known chain transfer agents, for example dodecanethiol or carbon tetrabromide, can be utilized to control the molecular weight properties of the polymer. Any suitable method for forming the latex polymer from the monomers may be used without restriction.

Various suitable colorants can be employed in toners of the present invention, including suitable colored pigments, dyes, and mixtures thereof, including carbon black, such as REGAL 330 carbon black, acetylene black, lamp black, aniline black, Chrome Yellow, Zinc Yellow, SICOFAST Yellow, SUNBRITE Yellow, LUNA Yellow, NOVAPERM Yellow, Chrome Orange, BAYPLAST Orange, Cadmium Red, LITHOL Scarlet, HOSTAPERM Red, FANAL PINK, HOSTAPERM Pink, LUPRETON Pink, LITHOL Red, RHODAMINE Lake B, Brilliant Carmine, HELIOGEN Blue, HOSTAPERM Blue, NEOPAN Blue, PV Fast Blue, CINQUASSI Green, HOSTAPERM Green, titanium dioxide, cobalt, nickel, iron powder, SICOPUR 4068 FF, and iron oxides such as MAPICO Black (Columbia) NP608 and NP604 (Northern Pigment), BAYFERROX 8610 (Bayer), M08699 (Mobay), TMB-100 (Magnox), mixtures thereof and the like.

The colorant, preferably carbon black, cyan, magenta and/or yellow colorant, is incorporated in an amount sufficient to impart the desired color to the toner. In general, pigment or dye is employed in an amount ranging from about 2% to about 35% by weight of the toner particles on a solids basis, preferably from about 5% to about 25% by weight and more preferably from about 5 to about 15% by weight.

Of course, as the colorants for each color are different, the amount of colorant present in each type of color toner typically is different. For example, in preferred embodiments of the present invention, a cyan toner may include about 3 to about 11% by weight of colorant (preferably Pigment Blue 15:3 from SUN), a magenta toner may include about 3 to about 15% by weight of colorant (preferably Pigment Red 122, Pigment Red 185, and/or mixtures thereof), a yellow toner may include about 3 to about 10% by weight of colorant (preferably Pigment Yellow 74), and a black toner may include about 3 to about 10% by weight of colorant (preferably carbon black).

In addition to the latex polymer binder and the colorant, the toners of the invention also contain wax. The wax is added to the toner formulation in order to aid toner release from the fuser roll, particularly in low oil or oil-less fuser designs. For emulsion/aggregation (E/A) toners, for example styrene-acrylate E/A toners, it has been conventional to add linear polyethylene waxes such as the POLYWAX® line of waxes available from Baker Petrolite to the toner composition. POLYWAX® 725 has been a particularly preferred wax for use with styrene-acrylate E/A toners.

However, in order to provide improved toner compositions, such as exhibiting improved gloss or print properties, compositional improvements are required. The present inventors have discovered that the use of other wax materials, in particular acid-containing wax materials, in place of conventional wax materials, provides these improved results.

In embodiments of the present invention, a wax including one or more acid-containing crystalline polymeric waxes is used as the wax component. By "crystalline polymeric waxes" it is meant a wax material that contains an ordered array of polymer chains within a polymer matrix which can be characterized by a crystalline melting point transition temperature, Tm. The crystalline melting temperature is the melting temperature of the crystalline domains of a polymer sample. This is in contrast to the glass transition temperature, Tg, which characterizes the temperature at which polymer chains begin to flow for the amorphous regions within a polymer. The wax may in addition to the acid-containing wax contain some wax components that do not contain acid functionality.

Preferred acid-containing crystalline waxes include one or more materials selected from the group of carboxylic acid-terminated polyethylene waxes, high acid waxes, and mixtures thereof. By "high acid waxes" it is meant a wax material that has a high acid content greater than about 50 mg KOH/g.

Suitable carboxylic acid-terminated polyethylene waxes include, but are not limited to, mixtures of carbon chains with the structure $CH_3-(CH_2)_{n-2}-COOH$, where there is a mixture of chain lengths, n, where the average chain length is preferably in the range of about 16 to about 50, and linear low molecular weight polyethylene, of similar average chain length. Suitable examples of such waxes include, but are not limited to, UNICID® 550 with n approximately equal to 40, and UNICID® 700 with n approximately equal to 50. For example, a particularly suitable crystalline carboxylic acid-terminated polyethylene wax is UNICID® 550, available from Baker Petrolite, (USA). UNICID® 550 consists of 80% carboxylic acid functionality with the remainder a linear, low molecular weight polyethylene of a similar chain length, and an acid value of 72 mg KOH/g and melting point of about 101° C. Other suitable waxes have a structure $CH_3-(CH_2)_n-COOH$, such as hexadecanoic or palmitic acid with n=16, heptadecanoic or margaric or daturic acid with n=17, octadecanoic or stearic acid with n=18:0, eicosanoic or arachidic acid with n=20, docosanoic or behenic acid with n=22, tetracosanoic or lignoceric acid with n=24, hexacosanoic or cerotic acid with n=26, heptacosanoic or carboceric acid with n=27, octacosanoic or montanic acid with n=28, triacontanoic or melissic acid with n=30, dotriacontanoic or lacceroic acid with n=32, tritriacontanoic or ceromelissic or psyllic acid, with n=33, tetratriacontanoic or geddic acid with n=34, pentatriacontanoic or ceroplastic acid with n=35, and the like.

Suitable examples of high acid waxes are acid waxes having a high acid content of, for example, greater than about 50% acid functionalized. Preferred high acid waxes are linear long chain aliphatic high acid waxes, where a long chain is a chain with 16 or more carbon atoms. Linear, saturated, aliphatic waxes, preferably having an end-finctionalized carboxylic acid, are particularly preferred. Also preferred are high acid waxes with acid content of greater than about 50 mg KOH/g. In embodiments, the high acid wax is preferably a montan wax, n-octacosanoic acid, $CH_3(CH_2)_{26}-COOH$, about 100% acid functionalized. Examples of such suitable montan waxes include, but are not limited to, Licowax® S, manufactured by Clariant GmbH (Germany), with an acid value of 127 to 160 mg KOH/g, Licowax® SW with acid value of 115–135, Licowax® UL with an acid value of 100–115 mg KOH/g and Licowax®

X101 with acid value 130–150. Other suitable high acid waxes include partly esterified montanic acid waxes, where some of the acid termination have been esterified, such as Licowax® U with an acid value of 72–92 mg KOH/g. Such high acid waxes are preferred, because it has been found that they provide adequate charge stability to the toner composition, since most emulsion/aggregation toner compositions have a high acid content (due to their constituent resin materials) and thus a resultant negative charge.

Preferably, according to embodiments of the present invention, the wax has a melting point of from about 65° C. to about 150° C., preferably of from about 80 to about 110° C. For example, the preferred wax UNICID® 550 has a melting point of about 101° C., and Licowax® S montan wax has a melting point of about 82° C.

Preferably, according to embodiments of the present invention, the toner particles are negative charging toner particles. Such toner particles according to the invention provide stable triboelectric charging properties to a developer composition.

To incorporate the wax into the toner, it is preferable for the wax to be in the form of an aqueous emulsion or dispersion of solid wax in water, where the solid wax particle size is usually in the range of from about 100 to about 500 nm.

For example, a wax emulsion sample containing Licowax® S montan wax (Witco, U.S.A.) and Neogen R-K anionic surfactant (Daiichi Kogyo Seiyaku Co. Ltd., Japan) can be prepared using a high pressure homogenizer. The surfactant-to-wax ratio in the emulsion can be, for example, 2.5 parts per hundred by weight. The sample descriptions are as follows:

A stable aqueous wax emulsion containing montan wax particles and one or more anionic stabilizers in water are produced using a high pressure homogenization process. The wax content of the emulsion can be in the range from about 10 to about 50 per cent by weight. The wax particles have an average diameter in the range from about 100 to about 500 nm as measured with a Microtrac UPA150 particle size analyzer, and have a peak melting point in the range from about 60 to about 130° C. as measured by DSC. A particularly useful carboxylic acid terminated polyethylene wax in the emulsion is UNICID® wax from baker Petrolite (U.S.A.) having a peak melting point of about 101° C. as measured by DSC. An example of a particularly useful anionic surfactant is Neogen R-K (Daiichi Kogyo Seiyaku Co. Ltd., Japan), which consists primarily of branched sodium dodecyl benzenene sulphonate. The amount of surfactant or stabilizer needed to stabilize the wax emulsion depends on the wax and surfactant structures. A typical amount of Neogen R-K surfactant needed to produce a stable wax emulsion is about 2.5 parts per hundredsurfactant-to-wax ratio.

The toners may contain from, for example, about 3 to about 15% by weight of the toner, on a dry basis, of the wax. Preferably, the toners contain from about 5 to about 13% by weight of the wax.

In addition, the toners of the invention may also optionally contain a coagulant and a flow agent such as colloidal silica. Suitable optional coagulants include any coagulant known or used in the art, including the well known coagulants polyaluminum chloride (PAC) and/or polyaluminum sulfosilicate (PASS). A preferred coagulant is polyaluminum chloride. The coagulant is present in the toner particles, exclusive of external additives and on a dry weight basis, in amounts of from 0 to about 3% by weight of the toner particles, preferably from about greater than 0 to about 2% by weight of the toner particles. The flow agent, if present, may be any colloidal silica such as SNOWTEX OL/OS colloidal silica. The colloidal silica is present in the toner particles, exclusive of external additives and on a dry weight basis, in amounts of from 0 to about 15% by weight of the toner particles, preferably from about greater than 0 to about 10% by weight of the toner particles.

The toner may also include additional known positive or negative charge additives in effective suitable amounts of, for example, from about 0.1 to about 5 weight percent of the toner, such as quaternary ammonium compounds inclusive of alkyl pyridinium halides, bisulfates, organic sulfate and sulfonate compositions such as disclosed in U.S. Pat. No. 4,338,390, cetyl pyridinium tetrafluoroborates, distearyl dimethyl ammonium methyl sulfate, aluminum salts or complexes, and the like.

Also, in preparing the toner by the emulsion aggregation procedure, one or more surfactants may be used in the process. Suitable surfactants include anionic, cationic and nonionic surfactants.

Anionic surfactants include sodium dodecylsulfate (SDS), sodium dodecyl benzene sulfonate, sodium dodecylnaphthalene sulfate, dialkyl benzenealkyl, sulfates and sulfonates, abitic acid, and the NEOGEN brand of anionic surfactants. An example of a preferred anionic surfactant is NEOGEN R-K available from Daiichi Kogyo Seiyaku Co. Ltd.(Japan), or Tayca Power BN2060 from Tayca Corporation (Japan), which consist primarily of branched sodium dodecyl benzene sulphonate.

Examples of cationic surfactants include dialkyl benzene alkyl ammonium chloride, lauryl trimethyl ammonium chloride, alkylbenzyl methyl ammonium chloride, alkyl benzyl dimethyl ammonium bromide, benzalkonium chloride, cetyl pyridinium bromide, $C_{12}$, $C_{15}$, $C_{17}$ trimethyl ammonium bromides, halide salts of quatemized polyoxyethylalkylamines, dodecyl benzyl triethyl ammonium chloride, MIRAPOL and ALKAQUAT available from Alkaril Chemical Company, SANISOL (benzalkonium chloride), available from Kao Chemicals, and the like. An example of a preferred cationic surfactant is SANISOL B-50 available from Kao Corp., which consists primarily of benzyl dimethyl alkonium chloride.

Examples of nonionic surfactants include polyvinyl alcohol, polyacrylic acid, methalose, methyl cellulose, ethyl cellulose, propyl cellulose, hydroxy ethyl cellulose, carboxy methyl cellulose, polyoxyethylene cetyl ether, polyoxyethylene lauryl ether, polyoxyethylene octyl ether, polyoxyethylene octylphenyl ether, polyoxyethylene oleyl ether, polyoxyethylene sorbitan monolaurate, polyoxyethylene stearyl ether, polyoxyethylene nonylphenyl ether, dialkylphenoxy poly(ethyleneoxy) ethanol, available from Rhone-Poulenc Inc. as IGEPAL CA-210, IGEPAL CA-520, IGEPAL CA-720, IGEPAL CO-890, IGEPAL CO-720, IGEPAL CO-290, IGEPAL CA-210, ANTAROX 890 and ANTAROX 897. An example of a preferred nonionic surfactant is ANTAROX 897 available from Rhone-Poulenc Inc., which consists primarily of alkyl phenol ethoxylate.

Any suitable emulsion aggregation procedure may be used in forming the emulsion aggregation toner particles without restriction. These procedures typically include the basic process steps of at least aggregating an emulsion containing binder, one or more colorants, optionally one or more surfactants, optionally a wax emulsion, optionally a coagulant and one or more additional optional additives to form aggregates, subsequently coalescing or fusing the aggregates, and then recovering, optionally washing and optionally drying the obtained emulsion aggregation toner particles.

An example emulsion/aggregation/coalescing process preferably includes forming a mixture of latex binder, colorant dispersion, wax emulsion, optional coagulant and deionized water in a vessel. The mixture is then stirred using a homogenizer until homogenized and then transferred to a reactor where the homogenized mixture is heated to a temperature of, for example, about 50° C. and held at such temperature for a period of time to permit aggregation of toner particles to the desired size. Once the desired size of aggregated toner particles is achieved, the pH of the mixture is adjusted in order to inhibit further toner aggregation. The toner particles are further heated to a temperature of, for example, about 90° C. and the pH lowered in order to enable the particles to coalesce and spherodize. The heater is then turned off and the reactor mixture allowed to cool to room temperature, at which point the aggregated and coalesced toner particles are recovered and optionally washed and dried.

Most preferably, following coalescence and aggregation, the particles are wet sieved through an orifice of a desired size in order to remove particles of too large a size, washed and treated to a desired pH, and then dried to a moisture content of, for example, less than 1% by weight.

The toner particles of the invention are preferably made to have the following physical properties when no external additives are present on the toner particles.

The toner particles preferably have a surface area, as measured by the well known BET method, of about 1.3 to about 6.5 m$^2$/g. More preferably, for cyan, yellow and black toner particles, the BET surface area is less than 2 m$^2$/g, preferably from about 1.4 to about 1.8 m$^2$/g, and for magenta toner, from about 1.4 to about 6.3 m$^2$/g.

It is also desirable to control the toner particle size and limit the amount of both fine and coarse toner particles in the toner. In a preferred embodiment, the toner particles have a very narrow particle size distribution with a lower number ratio geometric standard deviation (GSD) of approximately 1.15 to approximately 1.30, more preferably approximately less than 1.25. The toner particles of the invention also preferably have a size such that the upper geometric standard deviation (GSD) by volume is in the range of from about 1.15 to about 1.30, preferably from about 1.18 to about 1.22, more preferably less than 1.25. These GSD values for the toner particles of the invention indicate that the toner particles are made to have a very narrow particle size distribution.

Shape factor is also an important control process parameter associated with the toner being able to achieve optimal machine performance. The toner particles of the invention preferably have a shape factor of about 105 to about 170, more preferably about 110 to about 160, SF1*a. Scanning electron microscopy (SEM) is used to determine the shape factor analysis of the toners by SEM and image analysis (IA) is tested. The average particle shapes are quantified by employing the following shape factor (SF1 *a) formula: SF1 *a=100 πd$^2$/(4A), where A is the area of the particle and d is its major axis. A perfectly circular or spherical particle has a shape factor of exactly 100. The shape factor SF1 *a increases as the shape becomes more elongated or needle-like.

In addition to the foregoing, the toner particles of the present invention also have the following Theological and flow properties. First, the toner particles preferably have the following molecular weight values, each as determined by gel permeation chromatography (GPC) as known in the art. The binder of the toner particles preferably has a weight average molecular weight, Mw of from about 15,000 daltons to about 90,000 daltons.

Overall, the toner particles of the invention preferably have a weight average molecular weight (Mw) in the range of about 17,000 to about 60,000 daltons, a number average molecular weight (Mn) of about 9,000 to about 18,000 daltons, and a MWD of about 2.1 to about 10. MWD is a ratio of the Mw to Mn of the toner particles, and is a measure of the polydispersity, or width, of the polymer. For cyan and yellow toners, the toner particles preferably exhibit a weight average molecular weight (Mw) of about 22,000 to about 38,000 daltons, a number average molecular weight (Mn) of about 9,000 to about 13,000 daltons, and a MWD of about 2.2 to about 3.3. For black and magenta, the toner particles preferably exhibit a weight average molecular weight (Mw) of about 22,000 to about 38,000 daltons, a number average molecular weight (Mn) of about 9,000 to about 13,000 daltons, and a MWD of about 2 to about 10.

Further, the toners of the present invention preferably have a specified relationship between the molecular weight of the latex binder and the molecular weight of the toner particles obtained following the emulsion aggregation procedure. As understood in the art, the binder undergoes crosslinking during processing, and the extent of crosslinking can be controlled during the process. The relationship can best be seen with respect to the molecular peak values for the binder. Molecular peak is the value that represents the highest peak of the weight average molecular weight. In the present invention, the binder preferably has a molecular peak (Mp) in the range of from about 23,000 to about 28,0000, preferably from about 23,500 to about 27,500 daltons. The toner particles prepared from such binder also exhibit a high molecular peak, for example of about 25,000 to about 30,000, preferably about 26,000 to about 27,800 daltons, indicating that the molecular peak is driven by the properties of the binder rather than another component such as the colorant.

Another property of the toners of the present invention is the cohesivity of the particles prior to inclusion of any external additives. The greater the cohesivity, the less the toner particles are able to flow. The cohesivity of the toner particles, prior to inclusion of any external additives, may be from, for example, about 55 to about 98% for all colors of the toner. Cohesivity was measured by placing a known mass of toner, two grams, on top of a set of three screens, for example with screen meshes of 53 microns, 45 microns, and 38 microns in order from top to bottom, and vibrating the screens and toner for a fixed time at a fixed vibration amplitude, for example for 90 seconds at a 1 millimeter vibration amplitude. A device to perform this measurement is a Hosokawa Powders Tester, available from Micron Powders Systems. The toner cohesion value is related to the amount of toner remaining on each of the screens at the end of the time, and is calculated by the formula: % cohesion=50*A+30*B+10*C, where A, B and C are respectively the weight of the toner remaining on the 53 microns, 45 microns, and 38 microns screens, respectively. A cohesion value of 100% corresponds to all of the toner remaining on the top screen at the end of the vibration step and a cohesion value of zero corresponds to all of the toner passing through all three screens, that is, no toner remaining on any of the three screens at the end of the vibration step. The higher the cohesion value, the lesser the flowability of the toner.

Finally, the toner particles preferably have a bulk density of from about 0.22 to about 0.34 g/cc and a compressibility of from about 33 to about 51.

The toner particles of the invention are preferably blended with external additives following formation. Any suitable surface additives may be used in the present invention. Most preferred in the present invention are one or more of $SiO_2$, metal oxides such as, for example, $TiO_2$ and aluminum oxide, and a lubricating agent such as, for example, a metal salt of a fatty acid (e.g., zinc stearate (ZnSt), calcium stearate) or long chain alcohols such as UNILIN® 700, as external surface additives. In general, silica is applied to the toner surface for toner flow, tribo enhancement, admix control, improved development and transfer stability and higher toner blocking temperature. $TiO_2$ is applied for improved relative humidity (RH) stability, tribo control and improved development and transfer stability. Zinc stearate is preferably also used as an external additive for the toners of the invention, the zinc stearate providing lubricating properties. Zinc stearate provides developer conductivity and tribo enhancement, both due to its lubricating nature. In addition, zinc stearate enables higher toner charge and charge stability by increasing the number of contacts between toner and carrier particles. Calcium stearate and magnesium stearate provide similar functions. Most preferred is a commercially available zinc stearate known as Zinc Stearate L, obtained from Ferro Corporation. The external surface additives can be used with or without a coating.

Most preferably, the toners contain from, for example, about 0.1 to about 5 weight percent titania, about 0.1 to about 8 weight percent silica and about 0.1 to about 4 weight percent zinc stearate.

The toner particles of the invention can optionally be formulated into a developer composition by mixing the toner particles with carrier particles. Illustrative examples of carrier particles that can be selected for mixing with the toner composition prepared in accordance with the present invention include those particles that are capable of triboelectrically obtaining a charge of opposite polarity to that of the toner particles. Accordingly, in one embodiment the carrier particles may be selected so as to be of a negative polarity in order that the toner particles that are positively charged will adhere to and surround the carrier particles. Illustrative examples of such carrier particles include, iron, iron alloys, steel, nickel, ferrites, including ferrites that incorporate strontium, magnesium, manganese, copper, zinc, and the like, magnetites and the like. Additionally, there can be selected as carrier particles nickel berry carriers as disclosed in U.S. Pat. No. 3,847,604, the entire disclosure of which is totally incorporated herein by reference, comprised of nodular carrier beads of nickel, characterized by surfaces of reoccurring recesses and protrusions thereby providing particles with a relatively large external area. Other carriers are disclosed in U.S. Pat. Nos. 4,937,166 and 4,935,326, the disclosures of which are totally incorporated herein by reference.

The selected carrier particles can be used with or without a coating, the coating generally being comprised of acrylic and methacrylic polymers, such as methyl methacrylate, acrylic and methacrylic copolymers with fluoropolymers or with monoalkyl or dialklyamines, fluoropolymers, polyolefins, polystrenes, polyvinylidene fluoride resins, terpolymers of styrene, and a silane, such as triethoxy silane, tetrafluoroethylenes, other known coatings and the like.

The carrier particles can be mixed with the toner particles in various suitable combinations. The toner concentration is usually about 2% to about 10% by weight of toner and about 90% to about 98% by weight of carrier. However, one skilled in the art will recognize that different toner and carrier percentages may be used to achieve a developer composition with desired characteristics.

Toners of the present invention can be used in known electrostatographic imaging methods. Thus for example, the toners or developers of the invention can be charged, e.g., triboelectrically, and applied to an oppositely charged latent image on an imaging member such as a photoreceptor or ionographic receiver. The resultant toner image can then be transferred, either directly or via an intermediate transport member, to a support such as paper or a transparency sheet. The toner image can then be fused to the support by application of heat and/or pressure, for example with a heated fuser roll.

It is envisioned that the toners of the present invention may be used in any suitable procedure for forming an image with a toner, including in applications other than xerographic applications.

Specific embodiments of the invention will now be described in detail. These Examples are intended to be illustrative, and the invention is not limited to the materials, conditions, or process parameters set forth in these embodiments. All parts and percentages are by weight unless otherwise indicated.

EXAMPLES

Preparation of Latex Emulsion A:

A surfactant solution consisting of 0.9 grams Dowfax 2A1 (anionic emulsifier) and 514 grams de-ionized water is prepared by mixing for 10 minutes in a stainless steel holding tank. The holding tank is then purged with nitrogen for 5 minutes before transferring into the reactor. The reactor is then continuously purged with nitrogen while being stirred at 300 RPM. The reactor is then heated up to 76° C. at a controlled rate and held constant. In a separate container, 8.1 grams of ammonium persulfate initiator is dissolved in 45 grams of de-ionized water. Also in a second separate container, the monomer emulsion is prepared in the following manner. 426.6 grams of styrene, 113.4 grams of n-butyl acrylate and 16.2 grams of μ-CEA, 11.3 grams of 1-dodecanethiol, 1.89 grams of ADOD, 10.59 grams of Dowfax (anionic surfactant), and 257 grams of deionized water are mixed to form an emulsion. The ratio of styrene monomer to n-butyl acrylate monomer by weight is 79 to 21 percent. One percent of the above emulsion is then slowly fed into the reactor containing the aqueous surfactant phase at 76° C. to form the "seeds" while being purged with nitrogen. The initiator solution is then slowly charged into the reactor and after 20 minutes the rest of the emulsion is continuously fed in using metering pumps. Once all the monomer emulsion is charged into the main reactor, the temperature is held at 76° C. for an additional 2 hours to complete the reaction. Full cooling is then applied and the reactor temperature is reduced to 35° C. The product is collected into a holding tank after filtration through a 1 micron filter bag. After drying a portion of the latex the molecular properties are measured to be Mw=24,751, Mn=8,245 and the onset Tg is 51.46° C. The average particle size of the latex as measured by Disc Centrifuge is 203 nanometers and residual monomer as measured by GC as<50 ppm for styrene and<100 ppm for n-butyl acrylate. This latex is used to prepare 7 of the 8 EA toner particles described below, which contain various waxes at the same wax loading of 9 percent.

Preparation of Latex Emulsion B:

A surfactant solution consisting of 0.8 grams Dowfax 2A1 (anionic emulsifier) and 514 grams de-ionized water is prepared by mixing for 10 minutes in a stainless steel holding tank. The holding tank is then purged with nitrogen for 5 minutes before transferring into the reactor. The reactor is then continuously purged with nitrogen while being stirred at 300 RPM. The reactor is then heated up to 76° C. at a controlled rate and held constant. In a separate container, 8.1 grams of ammonium persulfate initiator is dissolved in 45 grams of de-ionized water. Also in a second separate container, the monomer emulsion is prepared in the following manner. 442.8 grams of styrene, 97.2 grams of n-butyl acrylate and 16.2 grams of β-CEA, 11.88 grams of 1-dodecanethiol, 1.89 grams of ADOD, 10.69 grams of Dowfax (anionic surfactant), and 257 grams of deionized water are mixed to form an emulsion. The ratio of styrene monomer to n-butyl acrylate monomer by weight is 82 to 18 percent. One percent of the above emulsion is then slowly fed into the reactor containing the aqueous surfactant phase at 76° C. to form the "seeds" while being purged with nitrogen. The initiator solution is then slowly charged into the reactor and after 20 minutes the rest of the emulsion is continuously fed in using metering pumps. Once all the monomer emulsion is charged into the main reactor, the temperature is held at 76° C. for an additional 2 hours to complete the reaction. Full cooling is then applied and the reactor temperature is reduced to 35° C. The product is collected into a holding tank after filtration through a 1 micron filter bag. After drying a portion of the latex the molecular properties are measured to be Mw=20,224, Mn=7,478 and the onset Tg is 53.46° C. The average particle size of the latex as measured by Disc Centrifuge is 254 nanometers and residual monomer as measured by GC as<50 ppm for styrene and<100 ppm for n-butyl acrylate. This latex is used to prepare one of the toners described below, which contains 9 percent of Polywax 725.

Preparation of Wax Dispersions:

Wax dispersions are prepared in a similar fashion for a number of experimental waxes, which include two high acid waxes, Licowax® S montan wax and UNICID® 550 carboxylic acid terminated polyethylene wax, and five low acid waxes, RC-160 camauba wax, Kemamide® S-180 stearyl stearamide wax, PETROLITE® EP-1104 branched polyethylene wax, POLYWAX® 725 and POLYWAX® 850 polyethylene wax. The same process and equipment is used for each wax. An example procedure is given for Licowax® S montan wax.

Wax Example: A stable aqueous wax emulsion A containing Licowax® S montan wax particles and one or more anionic stabilizers in water are produced using a high pressure homogenization process. An exemplary process to fabricate said wax emulsion is illustrated in FIG. 1 and is described as follows. The equipment includes a homogenizer 10, such as a Gaulin 15MR homogenizer (APV Homogenizer Group, Wilmington, Mass.) and a suitable reactor 20, such as a 1 US gal stainless steel jacketed reactor with steam heating and water cooling capability.

18.96 solids, 18.50 wax, 182 nm, 110° C. run About 770 grams of Licowax® S montan wax and about 19 grams of NEOGEN R-K™ anionic surfactant are added to about 3,011 grams of deionized water in the reactor and stirred at about 400 revolutions per minute. The reactor mixture is heated to about 110° C. in order to melt the wax. The aqueous mixture containing the molten wax is then pumped through the homogenizer at about 1 liter per minute for a period of about 30 minutes with the primary homogenizing valve full open and the secondary homogenizing partially closed such that the homogenizing pressure is about 1,000 pounds per square inch. Then the primary homogenizing valve is partially closed such that the homogenizing pressure increases to about 8,000 pounds per square inch. The reactor mixture is still kept at about 110° C. and circulated through the homogenizer at about 1 liter per minute for about 60 minutes. Thereafter, the homogenizer is stopped and the reactor mixture is cooled to room temperature at about 15° C. per minute, discharged into a product container and screened through a polyester filter bag having a pore size of about 5 microns. The resulting aqueous wax emulsion is comprised of about 18.50 percent by weight of wax and about 0.46 percent by weight of surfactant and has a volume average diameter ($d_{3,50}$) of about 182 nanometers as measured with a HONEYWELL MICROTRAC® UPA150 particle size analyzer.

The montan wax emulsion A as described above and six of the other waxes are prepared by the same procedure. The wax and surfactant contents and content and wax emulsion size are provided in Table 1 for the various wax emulsions.

TABLE 1

Wax Emulsions Used in the Toner Examples

| | Wax | Homog Temp (° C.) | Wax (%) | Surfactant (%) | $d_{3,50}$ (nm) |
|---|---|---|---|---|---|
| A | Licowax ® S | 110 | 18.50 | 0.46 | 182 |
| B | UNICID ® 550 | 125 | 18.68 | 0.47 | 223 |
| C | RC-160 carnauba | 105 | 17.83 | 0.45 | 287 |
| D | Kemamide ® S-180 | 120 | 18.68 | 0.47 | 188 |
| E | PETROLITE ® EP-1104 | 130 | 19.32 | 0.49 | 277 |
| F | POLYWAX ® 725 | 130 | 29.92 | 0.75 | 234 |
| G | POLYWAX ® 850 | 130 | 29.80 | 0.75 | 245 |

Comparative Example 1

Preparation of styrene/n-butyl acrylate emulsion/aggregation toner containing 9% RC-160 carnauba wax. Into a 4 liter glass reactor equipped with an overhead stirrer and heating mantle is dispersed 626.4 grams of the above Latex Emulsion A having a 42.66 percent solids content, 227.34 grams of RC-160 carnauba wax emulsion C having a solids content of 18.28 percent, 143.2 grams of a Blue Pigment PB15:3 dispersion having a solids content of 17.13 percent into 1334.0 grams of water with high shear stirring by means of a polytron. To this mixture is added 54 grams of a coagulant solution consisting of 10 weight percent poly (aluminiumchloride) (PAC) and 90 wt. % 0.02M $HNO_3$ solution. The PAC solution is added drop-wise at low rpm and as the viscosity of the pigmented latex mixture increases the rpm of the polytron probe also increases to 5,000 rpm for a period of 2 minutes. This produces a flocculation or heterocoagulation of gelled particles consisting of nanometer sized latex particles, 9% wax and 5% pigment for the core of the particles. The pigmented latex/wax slurry is heated at a controlled rate of 0.5° C./minute up to approximately 47° C. and held at this temperature for 75 minutes producing particles of approximately 5.0 microns and GSD by volume=1.21. Once the average particle size of 5.0 microns is achieved, 302.4 grams of the Latex Emulsion A is then introduced into the reactor while stirring to produce a shell around the pigmented wax core. After an additional 30 minutes the particle size measured is 5.7 microns with a GSD by volume=1.20. The pH of the resulting mixture is then adjusted from 2.0 to 7.0 with aqueous base solution of 4 percent sodium hydroxide and allowed to stir for an additional 15 minutes to freeze the particle size. Subsequently, the resulting mixture is heated to 93° C. at 1.0° C. per minute and the particle size measured is 5.86 microns with a GSD of 1.22. The pH is then reduced to 5.5 using a 2.5 percent Nitric acid solution. The resultant mixture is then allowed to coalesce for 5 hrs at a temperature of 93° C. The morphology of the particles is smooth and "potato" shape. The final particle size after cooling but before washing is 5.98 microns with a GSDv of 1.21. The particles are washed 6 times, where the 1st wash is conducted at pH of 10 at 63° C., followed by 3 washes with deionized water at room temperature, one wash carried out at a pH of 4.0 at 40° C., and finally the last wash with deionized water at room temperature. The final average particle size of the dried particles is 6.06 microns with $GSD_V$=1.20 and $GSD_n$=1.25. Two batches (450 gram scale) are combined together to give an overall yield of 794 grams (90 percent) yield. The glass transition temperature of this toner is 43.4° C. as measured by DSC and the sharp crystalline carnauba wax melting point is 84.12° C.

For the evaluation of this toner the particles are dried blended with a standard additive package consisting of RY50 from Nippon Aerosil, JMT2000 from Tayca, X-24 from Shin-Etsu, EA latex particles of 1–5 micron size, and Unilin wax particles from Baker-Petrolite to produce a free flowing toner. Then 805 grams of developer is prepared at 5% toner concentration by weight, using 76.5 grams of this blended toner and 773.5 grams of Xerox DocuColor 2240 carrier. The developer is conditioned overnight in A-zone and C-zone.

Comparative Example 2

Preparation of styrene/n-butyl acrylate emulsion/aggregation toner containing 9% Kemamide® S-180 stearyl stearamide wax. Into a 4 liter glass reactor equipped with an overhead stirrer and heating mantle is dispersed 626.4 grams of the above Latex Emulsion A having a 41.76 percent solids content, 216.78 grams of Kemamide® S-180 wax emulsion D having a solids content of 19.15 percent, 100.9 grams of a Blue Pigment PB 15:3 dispersion having a solids content of 24.3 percent into 1381.6 grams of water with high shear stirring by means of a polytron. To this mixture is added 54 grams of a coagulant solution consisting of 10 weight percent poly(aluminium chloride) (PAC) and 90 wt. % 0.02M $HNO_3$ solution. The PAC solution is added drop-wise at low rpm and as the viscosity of the pigmented latex mixture increases the rpm of the polytron probe also increases to 5,000 rpm for a period of 2 minutes. This produces a flocculation or heterocoagulation of gelled particles consisting of nanometer sized latex particles, 9% wax and 5% pigment for the core of the particles. The pigmented latex/wax slurry is heated at a controlled rate of 0.5° C./minute up to approximately 47° C. and held at this temperature for 75 minutes producing particles of approximately 5.0 microns and GSD by volume=1.21. Once the average particle size of 5.0 microns is achieved, 308.9 grams of the Latex Emulsion A is then introduced into the reactor while stirring to produce a shell around the pigmented wax core. After an additional 30 minutes the particle size measured is 5.7 microns with a GSD by volume=1.20. The pH of the resulting mixture is then adjusted from 2.0 to 7.0 with aqueous base solution of 4 percent sodium hydroxide and allowed to stir for an additional 15 minutes to freeze the particle size. Subsequently, the resulting mixture is heated to 93° C. at 1.0° C. per minute and the particle size measured is 5.86 microns with a GSD of 1.22. The pH is then reduced to 5.5 using a 2.5 percent Nitric acid solution. The resultant mixture is then allowed to coalesce for 5 hrs at a temperature of 93° C. The morphology of the particles is smooth and "potato" shape. The final particle size after cooling but before washing is 6.1 microns with a GSDv of 1.22. The particles are washed 6 times, where the 1st wash is conducted at pH of 10 at 63° C., followed by 3 washes with deionized water at room temperature, one wash carried out at a pH of 4.0 at 40° C., and finally the last wash with deionized water at room temperature. The final average particle size of the dried particles is 5.91 microns with $GSD_v$=1.22 and $GSD_n$=1.22. Two batches (450 gram scale) are combined together to give an overall yield of 792 grams (90 percent) yield. The glass transition temperature of this toner is 45.8° C. as measured by DSC and the melt point of the crystalline Kemamide® S-180 stearyl stearamide wax in the toner is very sharp at 92.6° C.

For the evaluation of this toner the particles are dried blended with surface additives and a developer was prepared and conditioned as described in Comparative Example 1 above.

Comparative Example 3

Preparation of styrene/n-butyl acrylate emulsion/aggregation toner containing 9% PETROLITE®® EP-1104 branched polyethylene wax. Into a 4 liter glass reactor equipped with an overhead stirrer and heating mantle is dispersed 626.4 grams of the above Latex Emulsion A having a 42.66 percent solids content, 209.55 grams of PETROLITE®EP-1104 branched polyethylene wax emulsion E having a solids content of 19.81 percent, 143.2 grams of a Blue Pigment PB15:3 dispersion having a solids content of 17.13 percent into 1351.7 grams of water with high shear stirring by means of a polytron. To this mixture is added 54 grams of a coagulant solution consisting of 10 weight percent poly(aluminiumchloride) (PAC) and 90 wt. % 0.02M $HNO_3$ solution. The PAC solution is added drop-wise at low rpm and as the viscosity of the pigmented latex mixture increases the rpm of the polytron probe also increases to 5,000 rpm for a period of 2 minutes. This produces a flocculation or heterocoagulation of gelled particles consisting of nanometer sized latex particles, 9% wax and 5% pigment for the core of the particles. The pigmented latex/wax slurry is heated at a controlled rate of 0.5° C./minute up to approximately 47° C. and held at this temperature for 75 minutes producing particles of approximately 5.0 microns and GSDv=1.21. Once the average particle size of 5.0 microns is achieved, 302.4 grams of the Latex Emulsion A is then introduced into the reactor while stirring to produce a shell around the pigmented wax core. After an additional 30 minutes the particle size measured is 5.7 microns with a GSDv=1.21. The pH of the resulting mixture is then adjusted from 2.0 to 7.0 with aqueous base solution of 4 percent sodium hydroxide and allowed to stir for an additional 15 minutes to freeze the particle size. Subsequently, the resulting mixture is heated to 93° C. at 1.0° C. per minute and the particle size measured is 5.84 microns with a GSD of 1.22. The pH is then reduced to 5.5 using a 2.5 percent Nitric acid solution. The resultant mixture is then allowed to coalesce for 5 hrs at a temperature of 93° C. The morphology of the particles is smooth and "potato" shape. The final particle size after cooling but before washing is 5.84 microns with a GSD by volume of 1.22. The particles are washed 6 times, where the 1st wash is conducted at pH of 10 at 63° C., followed by 3 washes with deionized water at room temperature, one wash carried out at a pH of 4.0 at 40° C., and finally the last wash with deionized water at room temperature. The final average particle size of the dried particles is 5.91 microns with $GSD_v=1.22$ and $GSD_n=1.25$. Two batches (450 gram scale) are combined together to give an overall yield of 590 grams (65.6 percent) yield. The glass transition temperature of this toner is 50.5° C. as measured by DSC.

For the evaluation of this toner the particles are dried blended with surface additives and a developer was prepared and conditioned as described in Comparative Example 1 above.

Comparative Example 4

Preparation of styrene/n-butyl acrylate emulsion/aggregation toner containing 9% POLYWAX® 725 polyethylene wax. Into a 4 liter glass reactor equipped with an overhead stirrer and heating mantle is dispersed 703.2 grams of the above Latex Emulsion B having a 38.00 percent solids content, 135.35 grams of POLYWAX® 725 polyethylene wax emulsion F dispersion having a solids content of 30.67 percent, 92.6 grams of a Blue Pigment PB15:3 dispersion having a solids content of 26.49 percent into 1399.7 grams of water with high shear stirring by means of a polytron. To this mixture is added 54 grams of a coagulant solution consisting of 10 weight percent poly(aluminiumchloride) (PAC) and 90 wt. % 0.02M $HNO_3$ solution. The PAC solution is added drop-wise at low rpm and as the viscosity of the pigmented latex mixture increases the rpm of the polytron probe also increases to 5,000 rpm for a period of 2 minutes. This produces a flocculation or heterocoagulation of gelled particles consisting of nanometer sized latex particles, 9% wax and 5% pigment for the core of the particles. The pigmented latex/wax slurry is heated at a controlled rate of 0.5° C./minute up to approximately 52° C. and held at this temperature or slightly higher to grow the particles to approximately 5.0 microns. Once the average particle size of 5.0 microns is achieved, 339.5 grams of the Latex Emulsion B is then introduced into the reactor while stirring. After an additional 30 minutes to 1 hour the particle size measured is 5.7 microns with a GSD of 1.20. The pH of the resulting mixture is then adjusted from 2.0 to 7.0 with aqueous base solution of 4 percent sodium hydroxide and allowed to stir for an additional 15 minutes. Subsequently, the resulting mixture is heated to 93° C. at 1.0° C. per minute and the particle size measured is 5.98 microns with a GSD by volume of 1.22 and GSD by number of 1.22. The pH is then reduced to 5.5 using a 2.5 percent Nitric acid solution. The resultant mixture is then allowed to coalesce for 2 hrs at a temperature of 93° C. The morphology of the particles is smooth and "potato" shape. The final particle size after cooling but before washing is 6.05 microns with a GSD by volume of 1.22. The particles are washed 6 times, where the 1st wash is conducted at pH of 10 at 63° C., followed by 3 washes with deionized water at room temperature, one wash carried out at a pH of 4.0 at 40° C., and finally the last wash with deionized water at room temperature. The final average particle size of the dried particles is 6.06 microns with $GSD_v=1.22$ and $GSD_n=1.25$. The glass transition temperature of this sample is measured by DSC and found to have Tg(onset)=49.9° C.

For the evaluation of this toner the particles are dried blended with surface additives and a developer was prepared and conditioned as described in Comparative Example 1 above.

Comparative Example 5

Preparation of styrene/n-butyl acrylate emulsion/aggregation toner containing POLYWAX® 850 polyethylene wax. Into a 4 liter glass reactor equipped with an overhead stirrer and heating mantle is dispersed 626.4 grams of the above Latex Emulsion A having a 42.66 percent solids content, 135.88 grams of POLYWAX® 850 polyethylene wax emulsion G having a solids content of 30.55 percent, 143.2 grams of a Blue Pigment PB15:3 dispersion having a solids content of 17.13 percent into 1425.4 grams of water with high shear stirring by means of a polytron. To this mixture is added 54 grams of a coagulant solution consisting of 10 weight percent poly(aluminium chloride) (PAC) and 90 wt. % 0.02M $HNO_3$ solution. The PAC solution is added drop-wise at low rpm and as the viscosity of the pigmented latex mixture increases the rpm of the polytron probe also increases to 5,000 rpm for a period of 2 minutes. This produces a flocculation or heterocoagulation of gelled particles consisting of nanometer sized latex particles, 9% wax and 5% pigment for the core of the particles. The pigmented latex/wax slurry is heated at a controlled rate of 0.5° C./minute up to approximately 47° C. and held at this temperature for 75 minutes producing particles of approximately 5.0 microns and GSDv=1.21. Once the average particle size of 5.0 microns is achieved, 302.4 grams of the Latex Emulsion A is then introduced into the reactor while stirring to produce a shell around the pigmented wax core. After an additional 30 minutes the particle size measured is 5.7 microns with a GSDv=1.21. The pH of the resulting mixture is then adjusted from 2.0 to 7.0 with aqueous base solution of 4 percent sodium hydroxide and allowed to stir for an additional 15 minutes to freeze the particle size. Subsequently, the resulting mixture is heated to 93° C. at 1.0° C. per minute and the particle size measured is 5.84 microns with a GSD of 1.22. The pH is then reduced to 5.5 using a 2.5 percent Nitric acid solution. The resultant mixture is then allowed to coalesce for 5 hrs at a temperature of 93° C. The morphology of the particles is smooth and "potato" shape. The final particle size after cooling but before washing is 5.94 microns with a GSD by volume of 1.22. The particles are washed 6 times, where the 1st wash is conducted at pH of 10 at 63° C., followed by 3 washes with deionized water at room temperature, one wash carried out at a pH of 4.0 at 40° C., and finally the last wash with deionized water at room temperature. The final average particle size of the dried particles is 6.21 microns with $GSD_v=1.21$ and $GSD_n=1.23$. Two batches (450 gram scale) are combined together to give an overall yield of 805 grams (89.4 percent) yield. The glass transition temperature of this toner is 49.9° C. as measured by DSC.

For the evaluation of this toner the particles are dried blended with surface additives and a developer was prepared and conditioned as described in Comparative Example 1 above

Example 1

Preparation of styrene/n-butyl acrylate emulsion/aggregation toner containing 9% Licowax® S montan wax. Into a 4 liter glass reactor equipped with an overhead stirrer and heating mantle is dispersed 626.4 grams of the above latex emulsion A having a 42.66 percent solids content, 218.95 grams of Licowax® S montan wax emulsion A having a solids content of 18.96 percent, 143.2 grams of a Blue Pigment PB15:3 dispersion having a solids content of 17.13 percent into 1342.4 grams of water with high shear stirring by means of a polytron. To this mixture is added 54 grams of a coagulant solution consisting of 10 weight percent poly(aluminiumchloride) (PAC) and 90 wt. % 0.02M $HNO_3$ solution. The PAC solution is added drop-wise at low rpm and as the viscosity of the pigmented latex mixture increases the rpm of the polytron probe also increases to 5,000 rpm for a period of 2 minutes. This produces a flocculation or heterocoagulation of gelled particles consisting of nanometer sized latex particles, 9% wax and 5% pigment for the core of the particles. The pigmented latex/wax slurry is heated at a controlled rate of 0.5° C./minute up to approximately 47° C. and held at this temperature for 75 minutes producing particles of approximately 5.0 microns and GSDv=1.21. Once the average particle size of 5.0 microns is achieved, 302.4 grams of the Latex Emulsion A is then introduced into the reactor while stirring to produce a shell around the pigmented wax core. After an additional 30 minutes the particle size measured is 5.7 microns with a GSDv=1.21. The pH of the resulting mixture is then adjusted from 2.0 to 7.0 with aqueous base solution of 4 percent sodium hydroxide and allowed to stir for an additional 15 minutes to freeze the particle size. Subsequently, the resulting mixture is heated to 93° C. at 1.0° C. per minute and the particle size measured is 6.10 microns with a GSD of 1.22. The pH is then reduced to 5.5 using a 2.5 percent Nitric acid solution. The resultant mixture is then allowed to coalesce for 5 hrs at a temperature of 93° C. The morphology of the particles is smooth and "potato" shape. The final particle size after cooling but before washing is 5.9 microns with a GSD by volume of 1.21. The particles are washed 6 times, where the 1st wash is conducted at pH of 10 at 63° C., followed by 3 washes with deionized water at room temperature, one wash carried out at a pH of 4.0 at 40° C., and finally the last wash with deionized water at room temperature. The final average particle size of the dried particles is 5.98 microns with $GSD_v$=1.21 and $GSD_n$=1.36. Two batches (450 gram scale) are combined together to give an overall yield of 808 grams (89.8 percent) yield. The glass transition temperature of this toner is 43.7° C. as measured by DSC.

For the evaluation of this toner the particles were dried blended with surface additives and a developer was prepared and conditioned as described in Comparative Example 1 above.

Example 2

Preparation of styrene/n-butyl acrylate emulsion/aggregation toner containing 9% UNICID® 550 carboxylic acid terminated polyethylene wax. Into a 4 liter glass reactor equipped with an overhead stirrer and heating mantle is dispersed 626.4 grams of the above latex emulsion A having a 42.66 percent solids content, 216.78 grams of UNICID® 550 carboxylic acid terminated polyethylene wax emulsion B having a solids content of 19.15 percent, 143.2 grams of a Blue Pigment PB 15:3 dispersion having a solids content of 17.13 percent into 1344.5 grams of water with high shear stirring by means of a polytron. To this mixture is added 54 grams of a coagulant solution consisting of 10 weight percent poly(aluminium chloride) (PAC) and 90 wt. % 0.02M $HNO_3$ solution. The PAC solution is added drop-wise at low rpm and as the viscosity of the pigmented latex mixture increases the rpm of the polytron probe also increases to 5,000 rpm for a period of 2 minutes. This produces a flocculation or heterocoagulation of gelled particles consisting of nanometer sized latex particles, 9% wax and 5% pigment for the core of the particles. The pigmented latex/wax slurry is heated at a controlled rate of 0.5° C./minute up to approximately 47° C. and held at this temperature for 75 minutes producing particles of approximately 5.0 microns and GSDv=1.21. Once the average particle size of 5.0 microns is achieved, 302.4 grams of the latex EA12–77 is then introduced into the reactor while stirring to produce a shell around the pigmented wax core. After an additional 30 minutes the particle size measured is 5.7 microns with a GSDv=1.21. The pH of the resulting mixture is then adjusted from 2.0 to 7.0 with aqueous base solution of 4 percent sodium hydroxide and allowed to stir for an additional 15 minutes to freeze the particle size. Subsequently, the resulting mixture is heated to 93° C. at 1.0° C. per minute and the particle size measured is 6.02 microns with a GSD of 1.20. The pH is then reduced to 5.5 using a 2.5 percent Nitric acid solution. The resultant mixture is then allowed to coalesce for 5 hrs at a temperature of 93° C. The morphology of the particles is smooth and "potato" shape. The final particle size after cooling but before washing is 6.06 microns with a GSD by volume of 1.20. The particles are washed 6 times, where the 1st wash is conducted at pH of 10 at 63° C., followed by 3 washes with deionized water at room temperature, one wash carried out at a pH of 4.0 at 40° C., and finally the last wash with deionized water at room temperature. The final average particle size of the dried particles is 6.06 microns with $GSD_v$=1.20 and $GSD_n$=1.22. Two batches (450 gram scale) are combined together to give an overall yield of 791.1 grams (87.9 percent) yield. The glass transition temperature of this toner is 45.6° C. as measured by DSC.

For the evaluation of this toner the particles were dried blended with surface additives and a developer was prepared and conditioned as described in Comparative Example 1 above Developer Evaluation:

Developers are evaluated by mixing Turbula mixer, measuring charge level and charge stability between 2 minutes and 60 minutes mixing, and then the admix, which is measured by adding a further 5% of toner to the developer, and then mixing for a further 15 seconds and 60 seconds.

Toner charging is measured on a charge spectrograph at a field of 100 V/cm, and the toner charge displacement from zero is measured as a trace on a porous substrate. The specifications for charging are that the charge level be between −4 and −11 mm displacement, and that the distribution of the admix bottom remain negative. All of the waxes tested passed these basic criteria. The data is shown in FIGS. 2a–g, and the relative charge stability is shown in Table 2. The best stability is shown when the value of the charge stability ratio is 1, which is the Licowax S (Example 1). The other high-acid wax is the Unicid 550 (Example 2), which also is one of the best in terms of charge stability. While one of the comparative examples, Comparative Example 1, is similar to the good performance of the Unicid high-acid wax, the Camauba wax is not nearly as effective as the Licowax S. No other wax studied approaches the stability performance of the high acid waxes. Particularly impressive is the A-zone stability, which is important, as with many waxes the charge ages with time to a value that is close to the minimum spec level, which is not desirable.

TABLE 2

Charge Stability Ratios for Inventive Waxes and Comparative Waxes

| Example | Wax | Charge stability (2'/60') A Zone | C Zone |
|---|---|---|---|
| 1 | Licowax ® S | 1.00 | 1.00 |
| 2 | UNICID ® 550 | 1.34 | 1.55 |
| Comp. 1 | RC-160 | 1.31 | 1.41 |
| Comp. 2 | Kemamide ® S-180 | 1.35 | 1.71 |
| Comp. 3 | PETROLITE ® EP-1104 | 1.58 | 1.66 |
| Comp. 4 | POLYWAX ® 725 | 1.60 | 2.33 |
| Comp. 5 | POLYWAX ® 850 | 1.49 | 2.09 |

While this invention has been described in conjunction with various exemplary embodiments, it is to be that many alternatives, modifications and variations would be apparent to those skilled in the art. Accordingly, Applicants intend to embrace all such alternatives, modifications and variations that follow in the spirit and scope of this invention.

What is claimed is:

1. A toner comprising particles of a resin, an optional colorant, and an acid-containing crystalline polymeric wax, wherein the acid-containing crystalline polymeric wax is selected from the group consisting of carboxylic acid-terminated polyethylene waxes, high acid waxes having an acid content of greater than about 50 mg KOH/g, and mixtures thereof, and wherein said toner particles are prepared by an emulsion aggregation process.

2. A toner according to claim 1, wherein said toner particles are negative charging toner particles.

3. A toner according to claim 1, wherein the acid-containing crystalline polymeric wax comprises a carboxylic acid-terminated polyethylene wax.

4. A toner according to claim 3, wherein the acid-containing crystalline polymeric wax has at least an 80% carboxylic acid functionality.

5. A toner according to claim 1, wherein the acid-containing crystalline polymeric wax comprises a high acid wax.

6. A toner according to claim 5, wherein the acid-containing crystalline polymeric wax is a montan wax.

7. A toner according to claim 5, wherein the acid-containing crystalline polymeric wax has an acid value of from about 127 to about 160 mg KOH/g.

8. A toner according to claim 1, wherein the acid-containing crystalline polymeric wax comprises a mixture of waxes.

9. A toner according to claim 1, wherein the emulsion aggregation process comprises
shearing a first ionic surfactant with a wax emulsion comprising said acid-containing crystalline polymeric wax, and a latex mixture comprising (a) a counterionic surfactant with a charge polarity of opposite sign to that of said first ionic surfactant, (b) a nonionic surfactant, and (c) a resin, thereby causing flocculation or heterocoagulation of formed particles of resin to form electrostatically bound aggregates; and
heating the electrostatically bound aggregates to form aggregates of at least about 1 micron in average particle diameter.

10. A toner according to claim 1, wherein the emulsion aggregation process comprises:
preparing a colorant dispersion in a solvent, which dispersion comprises a colorant and a first ionic surfactant;
shearing the colorant dispersion with a wax emulsion comprising said acid-containing crystalline polymeric wax, and a latex mixture comprising (a) a counterionic surfactant with a charge polarity of opposite sign to that of said first ionic surfactant, (b) a nonionic surfactant, and (c) a resin, thereby causing flocculation or heterocoagulation of formed particles of colorant and resin to form electrostatically bound aggregates; and
heating the electrostatically bound aggregates to form aggregates of at least about 1 micron in average particle diameter.

11. A toner according to claim 1, wherein the emulsion aggregation process comprises:
shearing an ionic surfactant with a wax emulsion comprising said acid-containing crystalline polymeric wax, and a latex mixture comprising (a) a flocculating agent, (b) a nonionic surfactant, and (c) a resin, thereby causing flocculation or heterocoagulation of formed particles of colorant and resin to form electrostatically bound aggregates;
heating the electrostatically bound aggregates to form aggregates of at least about 1 micron in average particle diameter.

12. A toner according to claim 1, wherein the emulsion aggregation process comprises:
preparing a colorant dispersion in a solvent, which dispersion comprises a colorant and an ionic surfactant;
shearing the colorant dispersion with a wax dispersion comprising said acid-containing crystalline polymeric wax, and a latex mixture comprising (a) a flocculating agent, (b) a nonionic surfactant, and (c) a resin, thereby causing flocculation or heterocoagulation of formed particles of colorant and resin to form electrostatically bound aggregates; and
heating the electrostatically bound aggregates to form aggregates of at least about 1 micron in average particle diameter.

13. A toner according to claim 1, wherein the emulsion aggregation process comprises:
preparing a colloidal solution comprising a resin, said acid-containing crystalline polymeric wax and an optional colorant, and
adding to the colloidal solution an aqueous solution containing a coalescence agent comprising an ionic metal salt to form toner particles.

14. A toner according to claim 1, wherein the emulsion aggregation process comprises:
providing a resin latex dispersion of a resin in an aqueous ionic surfactant solution;
providing a pigment dispersion in water of a pigment dispersed in water, an optional dispersant, and an optional an surfactant;
providing a wax dispersion comprising said acid-containing crystalline polymeric wax;
blending the resin latex dispersion shear with the pigment dispersion, and the wax dispersion under high shear to form a resin-pigment-wax blend;
heating the sheared blend at temperatures below a glass transition temperature (Tg) of the resin while continuously stirring to form aggregate particles;

heating the aggregate particles at temperatures above the Tg of the resin followed by reduction of the pH to form coalesced particles of a toner composition; and optionally separating and drying the toner composition.

15. A method of making toner particles, comprising:

shearing a first ionic surfactant with a wax emulsion comprising an acid-containing crystalline polymeric wax, and a latex mixture comprising (a) a counterionic surfactant with a charge polarity of opposite sign to that of said first ionic surfactant, (b) a nonionic surfactant, and (c) a resin, thereby causing flocculation or heterocoagulation of formed particles of resin to form electrostatically bound aggregates; and heating the electrostatically bound aggregates to form aggregates of at least about 1 micron in average particle diameter, wherein the acid-containing crystalline polymeric wax is selected from the group consisting of carboxylic acid-terminated polyethylene waxes, high acid waxes having an acid content of greater than about 50 mg KOH/g, and mixtures thereof.

16. A method according to claim 15, wherein said toner particles are negative charging toner particles.

17. A method according to claim 15, wherein the acid-containing crystalline polymeric wax comprises a carboxylic acid-terminated polyethylene wax.

18. A method according to claim 15, wherein the acid-containing crystalline polymeric wax comprises a high acid wax.

19. A method according to claim 15, wherein the acid-containing crystalline polymeric wax comprises a mixture of waxes.

* * * * *